United States Patent [19]
Craft et al.

[11] Patent Number: 5,025,211
[45] Date of Patent: Jun. 18, 1991

[54] TECHNIQUE FOR REDUCING ELECTROMAGNETIC INTERFERENCE

[75] Inventors: Adam B. Craft, Red Bank; Gabor P. Torok, Holmdel, both of N.J.

[73] Assignee: AT&T Bell Laboratories, Murray Hill, N.J.

[21] Appl. No.: 453,721

[22] Filed: Dec. 20, 1989

[51] Int. Cl.⁵ .................... G01R 31/02; H03H 1/00
[52] U.S. Cl. .................... 324/158 R; 333/12; 361/400
[58] Field of Search ............ 324/158 R, 95, 106; 333/12, 182, 185; 361/400, 424; 336/200

[56] References Cited

U.S. PATENT DOCUMENTS

| | | |
|---|---|---|
| 3,191,136 | 6/1965 | Connell et al. ............ 336/84 |
| 3,919,638 | 11/1975 | Belden, Jr. ............ 324/95 |
| 4,012,703 | 3/1977 | Chamberlayne ............ 333/24 |
| 4,201,965 | 5/1980 | Onyshkevych ............ 336/180 |
| 4,342,976 | 8/1982 | Ryser ............ 336/84 |
| 4,374,369 | 2/1983 | Sakamoto et al. ............ 333/182 |
| 4,758,808 | 7/1988 | Sasaki et al. ............ 333/185 |

Primary Examiner—Ernest F. Karlsen
Attorney, Agent, or Firm—David R. Padnes

[57] ABSTRACT

At least one pair of areas on a circuit pack or substrate is allocated for the placement of electromagnetic interference (EMI) absorbing material, e.g., split ferrite cores. All or a portion of the conductor paths for the circuit are routed between pairs of the allocated areas. After the circuit pack is developed and tested, if EMI suppression is required, the EMI-absorbing material extends around the conductors passing between the pairs of allocated areas using holes formed through the allocated pairs of areas. Such holes are formed prior to circuit assembly or, alternatively, are formed only as needed after circuit testing. A clip is used to secure the EMI-absorbing material to the circuit pack. Advantageously, the insertion and securement of the EMI-absorbing material does not require any soldering or special manufacturing tools or fixtures. Accordingly, it can be readily provided in any manufacturing process.

9 Claims, 5 Drawing Sheets

TECHNIQUE FOR REDUCING ELECTROMAGNETIC INTERFERENCE

TECHNICAL FIELD

The present proposal relates to apparatus and a method of reducing electromagnetic interference and, more particularly, to the use of electromagnetic interference absorbing material which is provided, as required, to preselected areas on a circuit board or substrate.

BACKGROUND OF THE INVENTION

Electromagnetic interference (EMI) is a long-standing problem in the electronics industry. Such interference can arise as an unwanted byproduct of normal circuit operation or can be induced into a circuit by external sources, e.g., electrostatic discharge. In any event, the result of such interference is a noise signal which interferes with the desired operation of electrical circuitry.

While it is possible to reduce the effects of electromagnetic radiation by judicious circuit design, a thorough analysis of EMI in the design process is very complex and such analysis is often not done. Moreover, even if the analysis is done, EMI is virtually impossible to completely eliminate. In addition to the detrimental effects of EMI, many system applications place strict limits on the electromagnetic radiation emanating from electronic equipment. Indeed, FCC Part 15 requirements specifically pertain to such limits and cover both home and business environments. Consequently, electronic equipment manufacturers use numerous techniques to mitigate EMI, such as the use of capacitors, magnetic filters, toroids and shield structures on circuit boards or substrates. While such techniques can meet system performance objectives, there are situations where such techniques do not provide a satisfactory solution. For example, after a circuit has been designed and initially fabricated, EMI can exceed system objectives or FCC requirements. To meet such objectives or requirements using the prior art techniques requires the addition of components on or off the circuit pack and such additions often require a circuit board redesign. Or, in other situations, certain circuit boards meet system objectives while other similar circuit boards, due to an accumulation of component tolerances, do not. To overcome this problem, either some of the fabricated circuits have to be discarded or partially reassembled with components having tighter tolerances, or components with such tighter tolerances have to be utilized for all circuits, or additional EMI-suppressing components have to be utilized which are external to the circuit pack or substrate. None of these solutions is optimum from time and cost standpoint. In addition, the use of EMI-suppressing components which are external to the circuit pack or substrate is often undesirable in applications, e.g., customer premises equipment, where such external components are located in the wiring coupled to the equipment. These additions, aside from being unsightly, typically require the customer's consent and intervention. Moreover, FCC rules require that the external EMI-suppressing components be registered and supplied with the manufactured circuitry, and this requirement can be unsatisfactory because it limits the customer's ability to utilize one piece of circuitry with different sets of cables. It would, therefore, be advantageous if an EMI-reducing technique could be developed which would overcome all of the above-described limitations of the prior art.

SUMMARY OF THE INVENTION

The present invention overcomes the limitations of the prior art by allocating certain areas of the circuit pack or substrate for the placement of EMI-suppressing components, designing the circuit and, in particular, routing the required conductor paths with recognition of such areas and then adding the EMI-suppressing components if, after testing, such components are required. Specifically, pursuant to the disclosed embodiments of the present invention, at least one pair of areas on a circuit pack or substrate is allocated for the placement of components fabricated from EMI-absorbing material, such as split ferrite cores. These areas are typically close to the pack or substrate interconnection device where the conductors are generally closely spaced. All or a portion of the conductor paths for the circuit are routed between pairs of the allocated areas. After the circuit pack is developed and tested, if EMI suppression is required, holes are formed through some or all of the allocated pairs and the EMI-absorbing material is inserted through these holes and secured by means of a clip. Alternatively, the punching of holes in the allocated areas can be done prior to testing and made a part of the assembly process.

A feature of the present invention is that the use of the EMI-absorbing material does not require any soldering or winding of the conductor about the material or the use of special manufacturing tools or fixtures. Accordingly, it can be readily provided, as required, in any manufacturing process.

DETAILED DESCRIPTION

Figure 1:
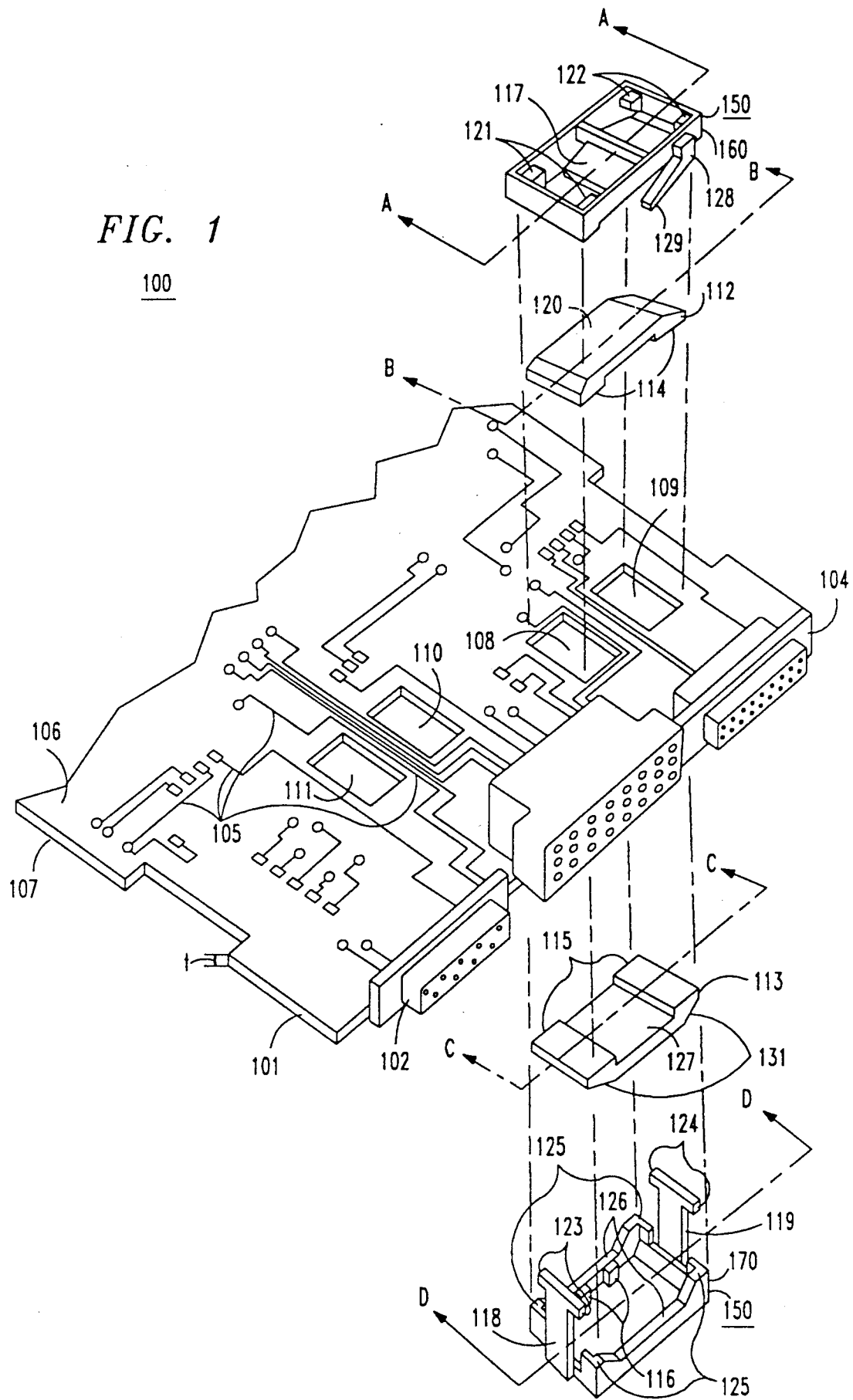
FIG. 1 is a partial perspective exploded view of a circuit pack which incorporates one embodiment of the present invention.

FIG. 1 shows a circuit pack 100 including a circuit board 101, connectors 102, 103 and 104, for interfacing the circuit pack to other circuits and/or external cabling, and a variety of discrete electrical components and integrated circuits (not shown). Circuit board 101 also includes a plurality of conductive paths 105 which are directly formed on both sides 106 and 107 of a rigid support member. The function of the conductive paths on circuit pack 100 is to interconnect the various circuit elements to realize the desired circuit function and to interconnect the circuitry to connectors 102, 103 and 104. The support member can be fabricated from any of a variety of materials, including glass-epoxy, epoxy-coated metal, etc. Such a circuit board is commonly referred to as a double-sided, rigid circuit board, with the term double-sided referring to the number of surfaces having conductive paths and the term rigid referring to a mechanical property of the support member. At this juncture, it should be understood that the present invention is not limited to any particular type of circuit board, i.e., rigid or flexible, single-sided, double-sided or multi-layer, etc. The term multi-layer denotes that the circuit board includes one or more internal layers having conductive paths. Indeed, the present invention is applicable to virtually any type of circuit board including the substrate materials, e.g., alumina, etc., used for support of large-scale integrated circuits. The term circuit board will be used herein to denote any type of printed wiring board or substrate having two external sides regardless of whether both surfaces have conductive paths formed thereon and regardless of the presence or absence of additional internal board layers.

A difficult and prevalent problem in designing a circuit pack is to mitigate the effects of EMI. Such interference can be radiated from an external source and coupled to the circuit pack via the cabling and/or circuits connected to connectors 102, 103 and 104 and can also be generated as a byproduct of the normal operation of one or more circuit elements in circuit pack 100. In the latter case, the generated EMI can affect the operation of other circuit elements on circuit pack 100 and can also affect the operation of other external circuitry. In either event, the EMI interference can propagate into and out of circuit pack 100 via the conductive paths thereon.

Figure 3:
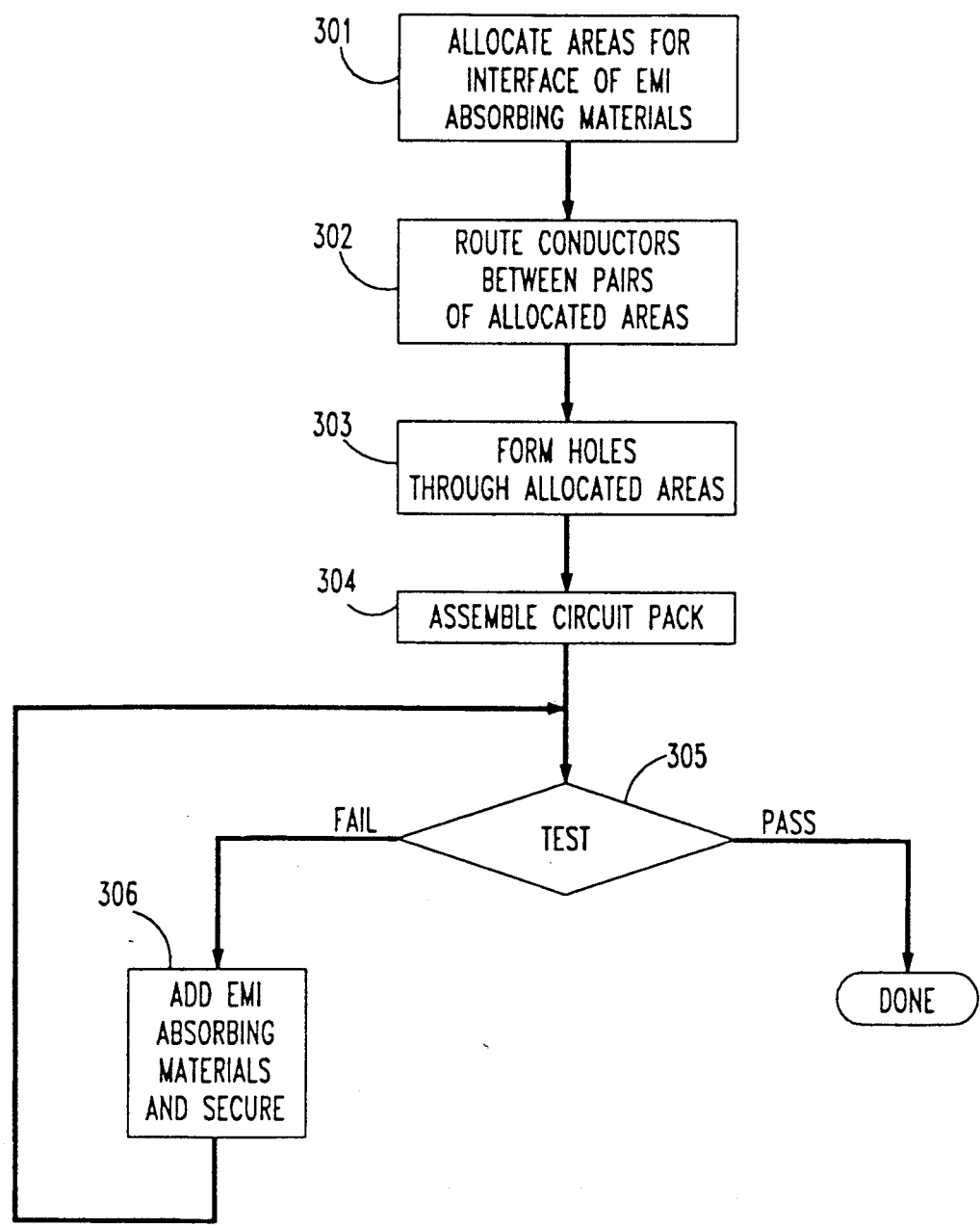
FIGS. 3 and 4 are flow charts of the steps used in practicing two alternative methodologies of the present invention.
Figure 4:
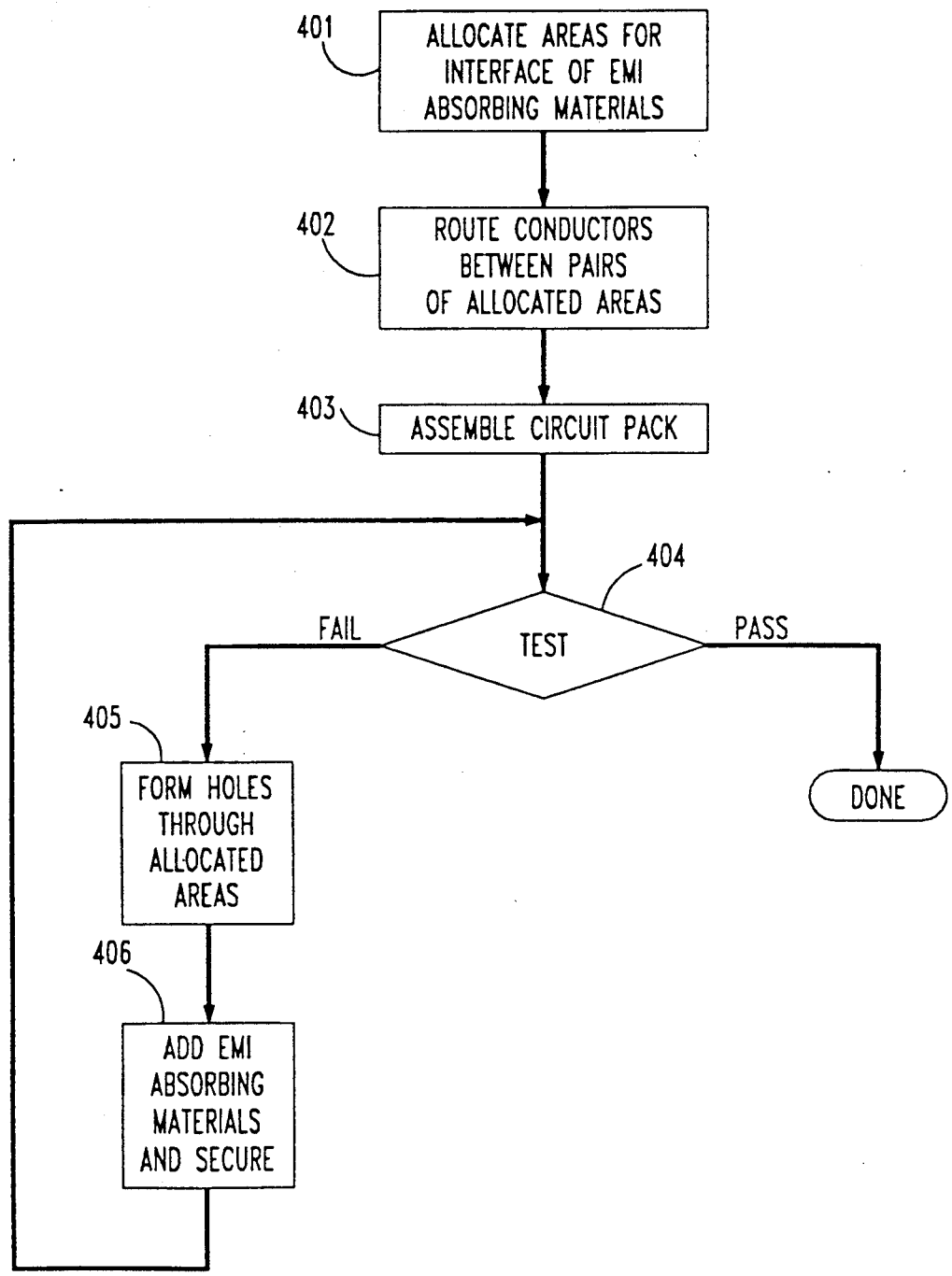

At this point, refer to FIGS. 3 and 4 which show alternative techniques in accordance with the present invention. Pursuant to the present invention, the effects of EMI interference can be mitigated through the use of a methodology wherein a plurality of areas on the substrate are allocated for the placement of EMI-absorbing material, such as split ferrite cores. This allocation is done at the time the circuit path is designed. This design operation involves both the location of the electrical components and integrated circuits on the circuit board as well as the routing of the required conductive paths. This location operation is shown by steps 301 and 401. All or a portion of the conductive paths are routed between pairs of allocated areas wherein each pair of allocated areas is associated with one device fabricated of EMI-absorbing material. The conductor routing operation is indicated by steps 302 and 402. In the routing operation, the portion of conductors lying between a pair of allocated areas must have their expected common mode currents flowing in the same direction. This restriction is required so that if, as will be discussed, EMI-absorbing material is added around such conductors, the common mode currents in these conductors will each contribute to a high frequency impedance which reduces the EMI noise currents. If only some of the conductors are routed between a pair of allocated areas, the conductors so routed are those believed to be most likely or susceptible to conduct noise currents associated with EMI. After, the circuit pack is assembled (step 304 or 403) and tested (step 305 or 404), the EMI-absorbing material is added (step 306 or 406) to those circuit boards which do not provide the desired test results in order to reduce the EMI interference and, accordingly, improve circuit performance. After this addition of EMI-absorbing material, such material surrounds the conductors routed between one or more pairs of allocated areas. The added EMI-absorbing material extends through holes in the allocated areas which are formed at or prior to circuit assembly or are formed after circuit assembly as required (step 303 or 405). The EMI-absorbing material is secured to the circuit pack through the use of a retaining clip. After the addition of EMI-absorbing material, the circuit packs containing this material may be retested. This retesting can be eliminated if it is firmly established that the addition of the electromagnetic absorbing material results in sufficient margins against EMI.

The above-described methodology does not require any special manufacturing tools or fixtures and can be readily provided in any manufacturing process. It should also be noted that the EMI-absorbing material is only added if required to meet circuit performance objectives and the addition of such material, if necessary, does not require circuit redesign or a new circuit layout.

Return now to FIG. 1 which shows allocated areas 108, 109, 110 and 111 and a plurality of conductors routed therebetween. While the location of the allocated areas on the circuit pack can vary, it is typically preferable to locate such areas close to the circuit board connectors where there is easy access to any conductor. This is especially true if the EMI interference to be suppressed is being coupled into or from the circuit pack via cabling connected to the circuit pack connectors.

Figure 2:
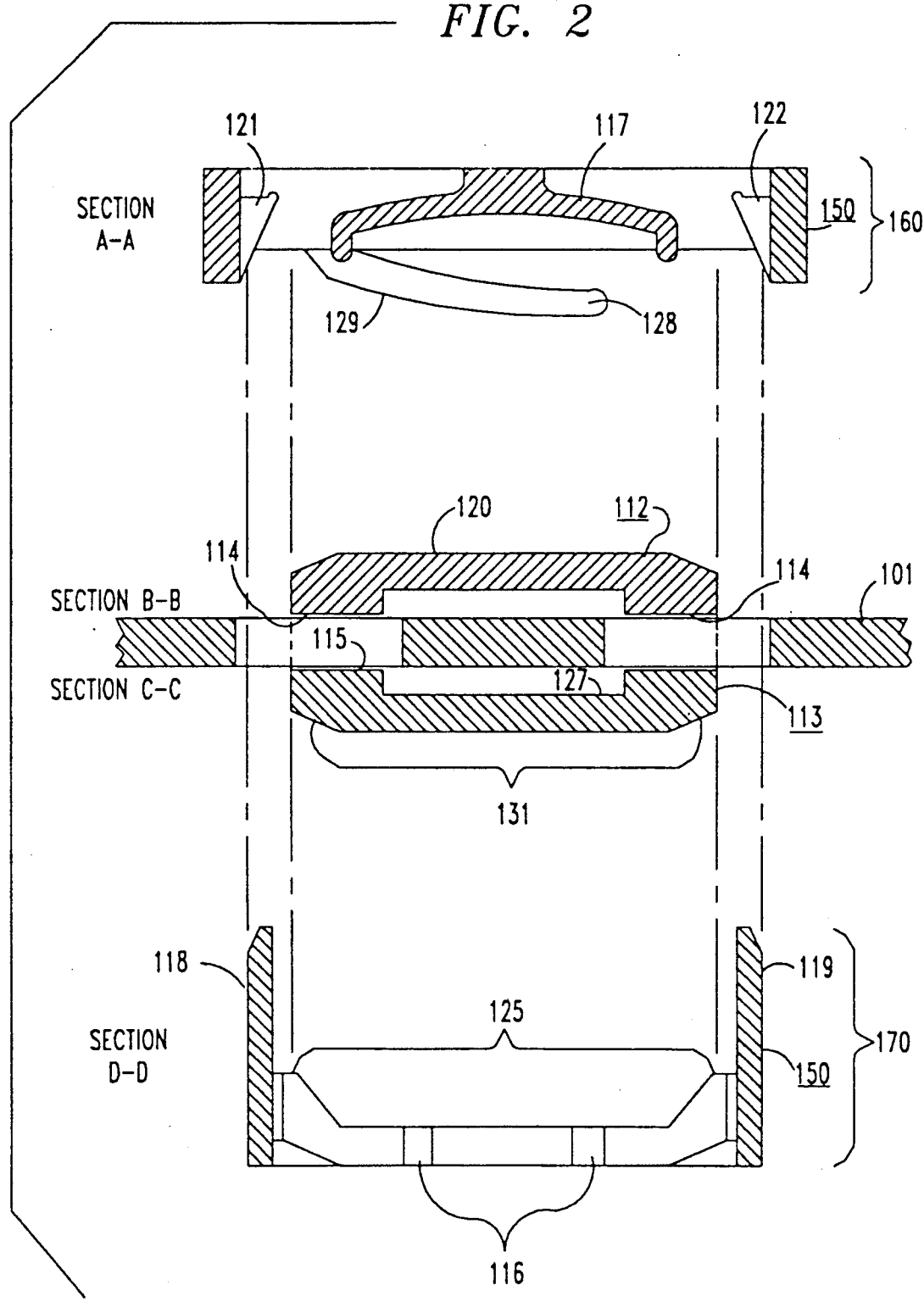
FIG. 2 is a cross-sectional view through section lines A, B, C, and D of FIG. 1 and shows the assembly of split ferrite cores, retaining clip and circuit board in accordance with the present invention.

Allocated areas 108 and 109 form a first pair of areas and are associated with a ferrite core including a first half 112 and a second half 113. Core halves 112 and 113 respectively include protrusions 114 and 115 which are sized to be receivable by holes formed in the allocated areas. Referring now also to FIG. 2, core half 112 is inserted through holes in allocated areas 108 and 109 from side 106 of circuit board 101 while core half 113 is inserted through the same holes from side 107 of the circuit board. The length of each protrusion is designed so that when each core half is inserted through its associated holes, protrusions 114 and 115 are in contact with one another.

To secure core halves to circuit pack 100, a retaining clip 150 is used having two components. Component 160 is formed with a cavity to receive split core 112 and component 170 is formed with a similar cavity to receive split core 113. Advantageously, at least one of the split core receiving cavities in the components incorporate a core retaining mechanism which snugly retains the assembly of a clip component and its received core half during circuit pack assembly. This retention mechanism is provided by collapsible ridges 116 which extend into each receiving cavity, deflect upon contact with a core half and, as a result, exert a retaining pressure on the received core half. A pair of ridges is shown in FIG. 1 extending from the same surface of component 170 and similar ridges are disposed (not shown) which extend from the opposite side of the split core receiving cavity. To assure that the cores are in abutment, the retaining clip includes a spring mechanism 117 which exerts a compressive force on surface 120 of split core 112. This force, in turn, biases protrusions 114 and 115 against one another and biases angled surfaces 131 of split core 113 against its mating surfaces in the cavity of component 170.

The retaining clip also advantageously includes a mechanism which provides locking and unlocking of the clip components without the use of any tools. This mechanism is provided by legs 118 and 119 which extend from component 170, protrude through the holes in allocated areas 108 and 109 and engage details 121 and 122 in component 160. To accomplish such engagement, legs 118 and 119 are flexed inwardly toward one another after insertion through the holes in allocated areas 108 and 109 and then, after extending beyond details 121 and 122, are released. Flexing of each leg is automatically provided by the sliding contact of these legs with ramped surfaces formed in details 121 and 122. Extensions 123 and 124 at the end of legs 118 and 119 respectively engage with details 121 and 122. The clip and split cores can, therefore, be easily disassembled by flexing legs 118 and 119 inwardly toward one another so as release their engagement with details 121 and 122. To aid in the alignment of split cores 112 and 113, locating corner ridges 125 are preferably formed in component 170.

When the clip components are interlocked, it is desirable that the protrusions above and below the circuit pack due to the clip assembly be minimized to reduce the assembled circuit pack size. Variations in the thickness, t, of the circuit pack can cause a gap to occur between surface 126 or 127 and side 107. To preclude such a gap, the clip preferably incorporates a spring mechanism to bias surface 126 or 127 against side 107 independent of the variations in thickness t. This spring mechanism is provided by a pair of cantilever extensions 128, one of which is shown in FIG. 1, which extend from component 160. Once components 160 and 170 are interlocked about the circuit board, each extension is flexed upwardly and surface 129 is biased against surface 106. This exerts an upward force on component 170, via the engagement of legs 118 and 119 with details 121 and 122, to draw surface 126 or 127 against side 107. The particular one of surfaces 126 or 127 which contacts side 107 is a function of clip component and split core tolerances.

Figure 5:
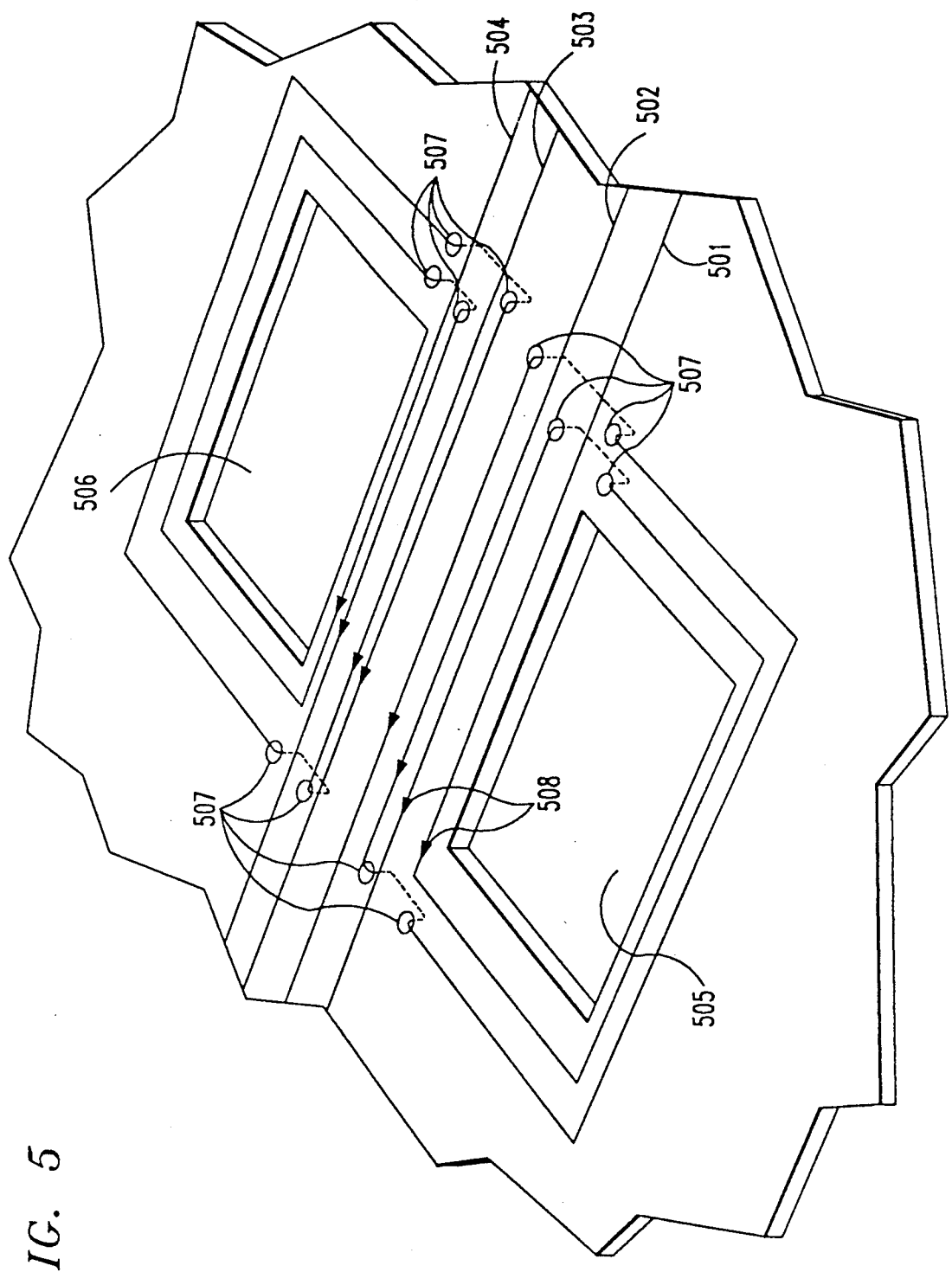
FIG. 5 is a partial perspective view of a circuit pack which incorporates another embodiment of the present invention.

An alternative embodiment of the present invention is shown in FIG. 5. This alternative embodiment is identical to the first except that the conductors routed between a pair of allocated areas are routed so that each of these conductors is routed so it passes between the pair of allocated areas at least two times. This multiple passage of each conductor between the allocated areas is not required for circuit operation but serves to increase the high frequency impedance provided by any later addition of surrounding EMI-absorbing material as described with respect to the first embodiment. In FIG. 5, conductors are shown routed between allocated areas 505 and 506 each having a hole formed therein to accept, if necessary, a pair of split ferrite cores. Each of conductors 501-504 passes between allocated areas 505 and 506 through the use of plated-through or via holes 507. It should be noted that the via holes are located so that the flow of current in conductors 501-504 is such each current will contribute to the magnetic flux density in any added ferrite cores as shown in FIGS. 1 and 2. Arrows 508 indicate the direction of current flow in conductors 501 through 504.

It should, of course, be understood that while the present invention has been disclosed in reference to the described embodiments, other arrangements should be apparent to those of ordinary skill in the art. For example, the addition of EMI material can be provided on a circuit-by-circuit basis depending on the performance of a circuit as tested without such material. Or, the EMI material can be added to all circuits of a particular type or designed for a particular circuit application. Therefore, circuits intended for home applications might include the EMI-absorbing material while the same circuits intended for business applications do not. In addition, a plurality of pairs of areas can be allocated and EMI-absorbing material can be added between none, some or all of these pairs of areas depending on the circuit performance or application.

We claim:

1. A method of reducing electromagnetic interference on a circuit pack including at least one conductive path formed on a circuit board having two sides, said method comprising the steps of allocating, during design of said circuit pack, at least one pair of areas on said circuit board for placement of electromagnetic interference absorbing material;

routing a predetermined portion of said conductive paths between said pair of areas;

fabricating said circuit pack;

testing said assembled circuit pack for compliance with predetermined criteria, said testing providing either a first or a second result; and adding, only in response to a first result of said testing, electromagnetic interference absorbing material which passes through holes in certain ones of said allocated pairs of areas, said material extending from said sides, the holes being formed at any time prior to the addition of said material.

2. The method of claim 1 wherein said electromagnetic interference absorbing material is a ferrite material.

3. The method of claim 1 wherein said material is a split core.

4. The method of claim 1 wherein said routed conductive paths are routed so that any common mode currents in each conductive path between said pairs of areas will each contribute to a high frequency impedance in any added material.

5. The method of claim 1 wherein said routed conductors are all of said conductive paths in said circuit pack.

6. The method of claim 1 wherein said circuit pack further includes at least one connector and said pairs of allocated areas are positioned close to said connector.

7. The method of claim 1 wherein each conductive path in said predetermined portion passes between an associated pair of allocated areas a plurality of times.

8. The method of claim 1 wherein the certain ones of said allocated pairs of areas are all of said allocated pairs of areas.

9. The method of claim 1 wherein the certain ones of said allocated pairs of areas are less than all of said allocated pairs of areas.

* * * * *